(12) United States Patent
Shoval et al.

(10) Patent No.: US 11,962,676 B2
(45) Date of Patent: Apr. 16, 2024

(54) PHASE MIXER NON-LINEARITY COMPENSATION WITHIN CLOCK AND DATA RECOVERY CIRCUITRY

(71) Applicant: Synopsys, Inc., Mountain View, CA (US)

(72) Inventors: Ayal S. Shoval, Toronto (CA); Tom Thomas, Mississauga (CA); Jin Chen, Eindhoven (NL); John T. Stonick, Portland, OR (US); Michael W. Lynch, Toronto (CA); Dino Anthony Toffolon, Ontario (CA)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/851,916

(22) Filed: Jun. 28, 2022

(65) Prior Publication Data
US 2023/0421344 A1    Dec. 28, 2023

(51) Int. Cl.
*H04L 25/40*    (2006.01)
*H04L 7/00*    (2006.01)

(52) U.S. Cl.
CPC .................................. *H04L 7/0033* (2013.01)

(58) Field of Classification Search
CPC ........ H04L 7/0033; H03L 7/087; H03L 7/093
USPC .......................................... 375/371–376, 327
See application file for complete search history.

(56) References Cited

U.S. PATENT DOCUMENTS

| 8,774,336 B2 | 7/2014 | Bae et al. |
| 8,913,688 B1 | 12/2014 | Jenkins |
| 10,516,403 B1 * | 12/2019 | Aouini .................... H03L 7/093 |
| 10,892,763 B1 * | 1/2021 | Hidaka .................... H03L 7/087 |
| 2015/0326203 A1 | 11/2015 | Da Dalt et al. |
| 2020/0212918 A1 | 7/2020 | Elkholy |

OTHER PUBLICATIONS

International Search Report and Written Opinion, Application No. PCT/US2023/021078, dated Aug. 21, 2023 consists of 14 pages.

\* cited by examiner

*Primary Examiner* — Phuong Phu
(74) *Attorney, Agent, or Firm* — Patterson + Sheridan, LLP

(57) ABSTRACT

A system and method which compensates for phase mixer circuit non-linearities within a clock and data recovery (CDR) system during active operation. The CDR system includes compensation circuitry and phase accumulation circuitry. The compensation circuitry generates a first compensation signal based on a first compensation value. The phase accumulation circuitry receives the first compensation signal and a phase accumulator input update signal. The phase accumulation circuitry combines the first compensation signal with the phase accumulator input update signal to compensate for a first non-linearity within phase mixer (PMI) circuitry.

20 Claims, 7 Drawing Sheets

PHASE MIXER NON-LINEARITY COMPENSATION WITHIN CLOCK AND DATA RECOVERY CIRCUITRY

TECHNICAL FIELD

The present disclosure relates to phase mixer circuitry of clock and data recovery circuitry, and, more particularly, to a system and method for mitigating differential non-linearity of phase mixer circuitry during operation.

BACKGROUND

A communication system includes a transmitter circuitry and receiver circuitry. The receiver circuitry is communicatively connected to the transmitter circuitry. The transmitter circuitry and the receiver circuitry each include clock generation circuitry (e.g., phase lock loop (PLL) circuitry, or other clock generation circuitry) that respectively generate a transmitter clock signal and a receiver clock signal. Further, the receiver circuitry receives a data signal transmitted by the transmitter circuitry. As differences may exist between the receiver clock signal and the transmitter clock signal, errors may be present within the data signal received by the receiver circuitry. To mitigate errors within the received data signal, the receiver circuitry includes clock and data recovery (CDR) circuitry that mitigates differences in phase and frequency between the clock signal of the receiver circuitry and the clock signal of the transmitter circuitry.

SUMMARY

In one example, a clock and data recovery (CDR) system includes compensation circuitry and phase accumulation circuitry. The compensation circuitry generates a first compensation signal based on a first compensation value. The phase accumulation circuitry receives the first compensation signal and a phase accumulator input update signal. The phase accumulation circuitry combines the first compensation signal with the phase accumulator input update signal to compensate for a first non-linearity within phase mixer (PMIX) circuitry.

In one example, a method includes receiving a first compensation value, and generating a first compensation signal based on the first compensation value. Further, the method includes compensating for a first non-linearity within PMIX circuitry based on the first compensation signal and a phase accumulator input update signal. The method further includes generating a clock signal based on the compensated signal by the PMIX circuitry.

In one example, a non-transitory computer readable medium includes stored instructions. The instructions which when executed by a processor, cause the processor to provide compensation circuitry of CDR circuitry. The compensation circuitry includes an input node that receives a first compensation value. The compensation circuitry further includes a summation element that subtracts a delayed version of the first compensation value from the compensation value to generate a first non-linearity value. The compensation circuitry generates a first compensation signal based on the first non-linearity value. The processor further provides phase accumulation circuitry of the CDR circuitry. The phase accumulation circuitry compensates for a first non-linearity within PMIX circuitry based on the first compensation signal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a system and method for providing phase mixer non-linearity compensation within clock and data recovery circuitry.

A communication system includes a transmitter circuitry and receiver circuitry. The receiver circuitry receives a data signal from the transmitter circuitry. However, as the receiver circuitry is separate from the transmitter circuitry, the clock signal of the receiver circuitry may differ from the clock signal of the transmitter circuitry. For example, the phase and frequency of the clock signal of the receiver circuitry differs from those of the clock signal of the transmitter circuitry. The differences in the phase and/or frequency of the clock signals may result in errors within the received data signal. For example, as the transmitter circuitry transmits the data signal based on the clock signal of the transmitter circuitry, the rising edges of the data signal are associated with the rising edges of the clock signal of the transmitter circuitry. As the clock signal of the receiver circuitry differs (e.g., has a different phase/frequency) from the clock signal of the transmitter circuitry, errors may be introduced within the received data signal.

In one or more examples, the receiver circuitry includes clock and data recovery (CDR) circuitry to align the rising edges of the clock signal of the receiver circuitry with the rising edges of the data signal. However, the CDR circuitry may experience differential non-linearity (DNL) due to the phase mixer (PMIX) circuitry within the CDR circuitry and/or due to latency of the CDR circuitry A CDR suffering from DNL or latency is not able to perfectly phase align the rising edges of clock signal of the receiver circuitry with the rising edges of the data signal, and phase errors are generated within the received clock signal. In the following, compensation of non-linearities and latency of CDR circuitry are described, improving the performance of the corresponding receiver circuitry, and mitigating errors within a received data signal. Technical advantages of the present disclosure include, but are not limited to, compensating for non-linearities of the CDR circuitry based on a phase mixer (PMIX) code of the PMIX circuitry of the CDR circuitry. Compensating for the non-linearities within the CDR circuitry improves the performance of the CDR circuitry, improving the alignment of a transmitter circuitry clock signal and a receiver circuitry clock signal. Accordingly, errors within a data signal received by the receiver circuitry are compensated.

Figure 1:
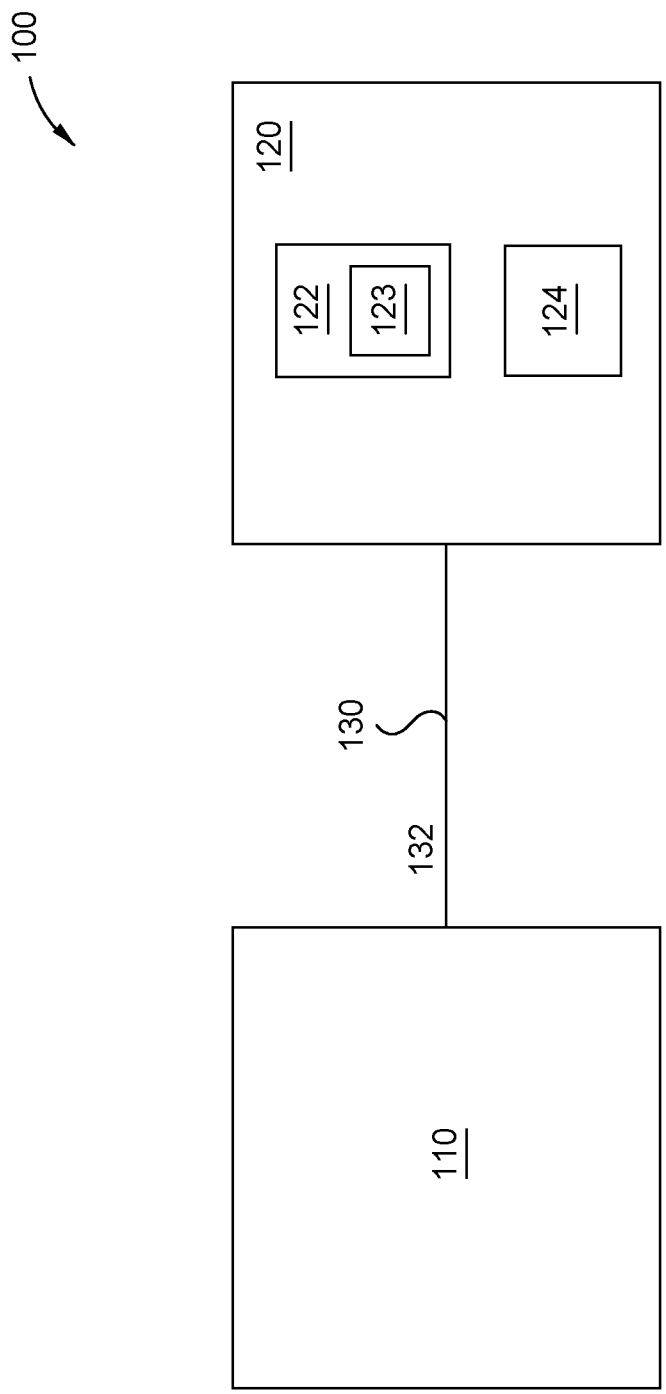
FIG. 1 illustrates a block diagram of a communication system, according to one or more examples.

FIG. 1 illustrates a communication system 100, according to one or more examples. The communication system 100 includes transmitter circuitry 110 and receiver circuitry 120 communicatively connected to each other via channel 130. In one example, the communication system 100 is a serial communication system. Further, in one or more examples, the transmitter circuitry 110 and the receiver circuitry 120 are each part of a serializer-deserializer (SerDes). The communication system 100 is included within one or more integrated circuit (IC) devices. For example, the transmitter circuitry 110 is included within a first IC device and the receiver circuitry 120 is included in a second IC device.

The transmitter circuitry 110 drives (e.g., transmits) a data signal 132 to the receiver circuitry 120 via the channel 130. In one example, the data signal 132 is a serial data signal. The data signal 132 includes one or more symbols. The transmitter circuitry 110 converts each symbol into a voltage which is driven onto the channel 130 and received by the receiver circuitry 120. The transmitter circuitry 110 uses one or more modulation schemes (e.g., a binary non-return-to-zero modulation scheme or a multi-level digital baseband modulation scheme, among others). Further, the transmitter circuitry 110 drives the data signal 132 based on a transmitter clock signal. The transmitter clock signal may be generated locally within the transmitter by clock generation circuitry (e.g., phase-locked loop (PLL) circuitry).

The receiver circuitry 120 receives the data signal 132 from the transmitter circuitry 110 via the channel 130. In one or more examples, the receiver circuitry 120 includes CDR circuitry 122 that generates a clock signal that is based on the transmitter rate of the data signal 132, and accordingly, the clock signal of the transmitter circuitry 110. In one example, the frequency and/or phase of the clock signal is adjusted to be aligned with that of the reference clock signal. In one or more examples, the CDR circuitry 122 adjusts the phase of the clock signal, positioning the clock signal at the mid-position in time of each pulse of the data signal 132 transmitted via the channel 130. In one example, the CDR circuitry 122 is part of equalization circuitry that mitigates inter-symbol interference (ISI) via an equalization process. The equalization process includes restoring the frequency dependent amplitude distortions that occur within the data signal transmitted by the transmitter circuitry 110 via the channel 130.

The receiver circuitry 120 further includes signal processing circuitry 124 that decodes and processes the data signal 132 based on the clock signal generated by the CDR circuitry 122.

In one or more examples, the CDR circuitry 122 includes a phase-locked loop (PLL) circuitry followed by phase mixer (PMIX) circuitry 123. In such an example, the CDR circuitry 122 generates a clock signal with a frequency that is a scalar version of a reference frequency applied to the PLL circuitry. In one or more examples, the frequency of the clock signal may not match that of the data signal 132, as a delta frequency exists between the frequency of the PLL circuitry of the transmitter circuitry 110 and the frequency of PLL circuitry of the receiver circuitry 120. The delta frequency may be measured in parts per million (PPM). The CDR circuitry 122 compensates for the PPM through the use of the PMIX circuitry 123. In one or more examples, the rising edge of the clock signal of the receiver circuitry 120 provided by the PLL circuitry of the receiver circuitry 120 is unaligned with the rising edge of the clock signal of the transmitter circuitry 110. In one or more examples, the PMIX circuitry 123 is used to align the rising edges of the clock signal of the receiver circuitry 120 with the rising edge of the clock signal of the transmitter circuitry 110, mitigating the PPM between the clock signal of the transmitter circuitry and the clock signal of the receiver circuitry.

In one or more examples, the PMIX circuitry of the CDR circuitry 122 synthesizes multiple clock edges of the corresponding PLL clock signal and through the use of a feedback mechanism to select the edge of the clock signals that is aligned with the rising edge of the data signal 132. In one example, for a fixed frequency PPM, if the PMIX circuitry 123 generates M phases over 360 degrees of a scaled version of the PLL clock signal period, the PMIX circuitry 123 is moved from one phase to the next in a period of time to ensure that clock signal of the receiver circuitry 120 is aligned with consecutive rising edges of the clock signal of the transmitter circuitry 110. In one or more examples, the change in phase per unit time of the clock signal of the receiver circuitry 120 represents the effective frequency of the clock signal at the output of the PMIX circuitry 123. Specifically, as illustrated by Equation 1, if a fixed frequency (f) PPM exits between the clock domain of the transmitter circuitry 110 and the receiver circuitry 120, a change in the phase (φ) of the clock signal of the receiver circuitry with respect to time (t) is constant.

$$f = \frac{1}{2\pi}\frac{\partial \phi}{\partial t} \qquad \text{Equation 1}$$

Accordingly, to mitigate the PPM between the receiver circuitry clock signal and the transmitter circuitry clock signal, the PMIX circuitry is advanced in phase in equal quantities of phase with time, and the phases of the PMIX circuitry are linearly spaced over 360 degrees.

In one or more examples, performance of the PMIX circuitry 123 is negatively affected by process, and temperature (PVT) variations, as well as mismatches due to circuit fabrication and circuit operating conditions. Accordingly, the PMIX circuitry 123 may not generate linearly spaced clock signal. Further, the clock signal generated by the PMIX circuitry 123 may be negatively affected by amplitude dependent phase variations within the PMIX circuitry 123. For example, the PMIX circuitry 123 generates M phases (where M is one or more) in 360 degrees of a scaled version of the clock signal of the receiver circuitry 120. However, the phases have DNL, or non-equal phase steps. The CDR circuitry 122 mitigates at least a portion of the DNL through the use of feedback. However, not all of the DNL may be removed due to latency and/or finite loop bandwidth of the CDR circuitry 122. For examples, if changes occur at a rate that is beyond the bandwidth of the CDR circuitry 122, the changes may not be tracked by the CDR circuitry 122. Accordingly, sampling phase errors may occur (or deterministic jitter) within the receiver circuitry 120, reducing the symbol detection performance of the receiver circuitry 120, introducing errors within the received data signal 132. Further, the sampling phase error is repeated with a periodicity depending on the number of phases in the PMIX circuitry 123, and the frequency PPM difference between the transmitter circuitry 110 and the receiver circuitry 120. The periodicity of the sampling phase error leads to spectral tones in the phase error power spectral density.

The DNL within the PMIX circuitry 123 negatively affects the performance of the receiver circuitry 120. Accordingly, compensating the DNL improves the performance of the receiver circuitry 120. As is described in greater detail in the following, the DNL of the PMIX circuitry 123 can be compensated for during operation of the CDR circuitry 122, improving the performance of the receiver circuitry 120, mitigating errors within the received data signal 132.

Figure 2:
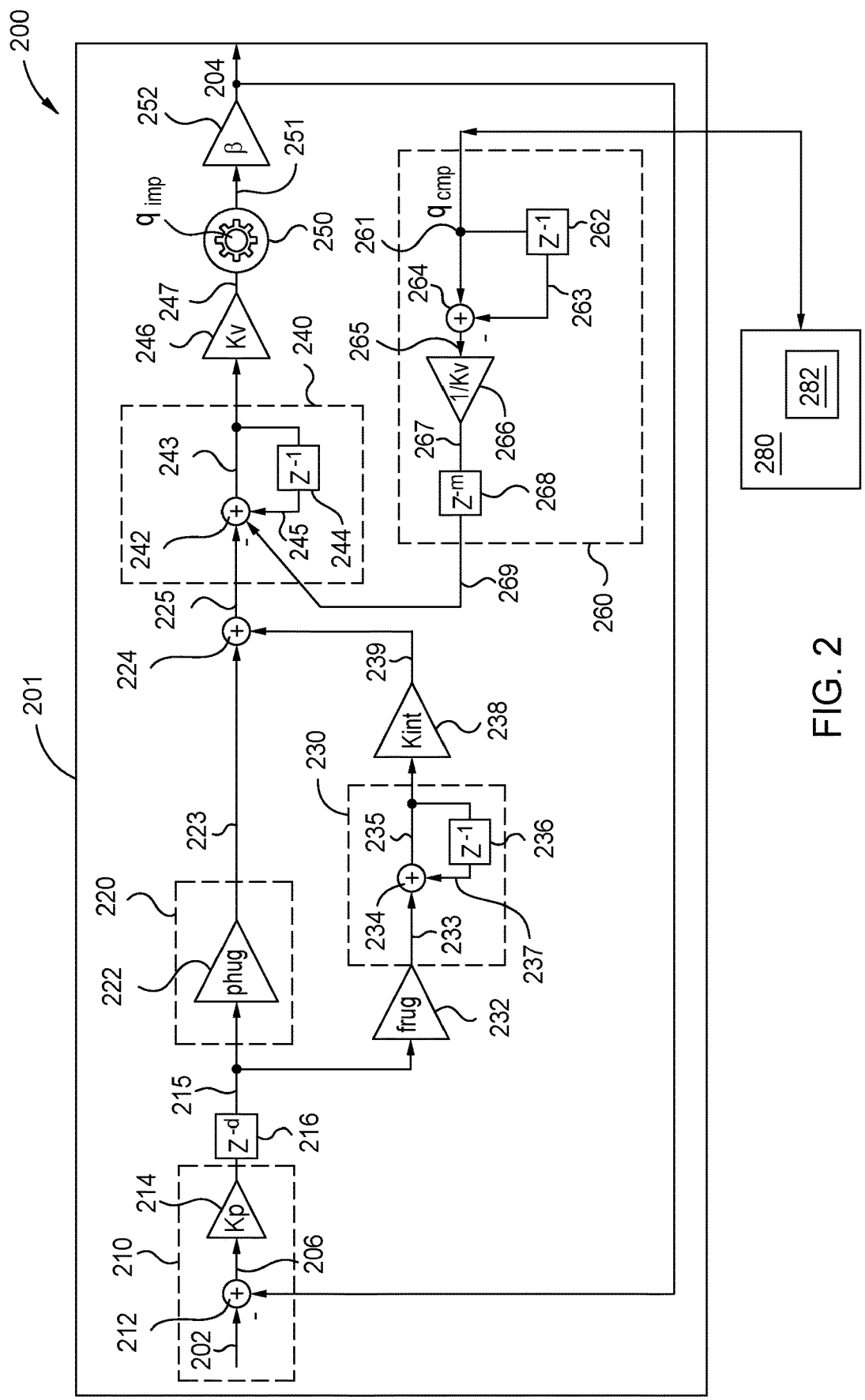
FIG. 2 illustrates a schematic block diagram of clock and data recovery system of receiver circuitry, according to one or more examples.

FIG. 2 illustrates CDR system 200, according to one or more examples. The CDR system includes CDR circuitry 201 and memory 280. The CDR circuitry 201 includes phase detector 210, phase update gain 220, frequency accumulator 230, phase accumulation circuitry 240, PMIX circuitry 250, and compensation circuitry 260.

In one or more examples, the CDR circuitry 201 receives the input signal 202. The input signal 202 may be the data signal 132 of FIG. 1. The phase detector 210 receives the input signal 202 and clock signal 204, and generates an error signal 206 (e.g., a phase error signal). The clock signal 204 functions as a feedback signal. The error signal 206 corresponds to a difference in phase between the input signal 202 and the clock signal 204. In one example, the phase detector 210 includes a subtractor 212 that subtracts the clock signal 204 from the input signal 202. The error signal 206 is amplified by the amplifier 214 and then delayed by delay element 216 to generate delayed error signal 215. The delay of the delay element 216 is d. The amplifier 214 represents the gain Kp of the phase detector 210.

In one or more examples, the clock signal 204 has an output phase $\phi_{out}$. The output phase $\phi_{out}$ of the clock signal 204 tracks the phase of the input signal 202, and the phase error $\phi_{err}$ of the signal 206. In one example, the phase error $\phi_{err}$ of the signal 206 is reduced to zero.

The delayed error signal 215 is amplified by amplifier 222 of the phase update gain 220 to generate signal 223. The amplifier 222 may be represented by the parameter phug, e.g., gain of the phase update gain 220. In one or more examples, the phase update gain 220 is referred to as the CDR proportional path (e.g., phase path). The delayed error signal 215 is received by the amplifier 232, which generates the signal 233. The amplifier 232 is the CDR frequency update gain and may be represented by the parameter frug. The frequency accumulator 230 may be referred to as the integral path (e.g., frequency path). The signal 233 is added to the delayed signal 237 by the summation element 234 of the frequency accumulator 230 to generate the signal 235, which is delayed by delay unit 236 of the frequency accumulator 230 to generate the delayed signal 237. The delay of the delay unit 236 is 1 update cycle. Adding the signal 233 to the delayed signal 237 adds the previous value of the signal 235 to the signal 233. Accordingly, the frequency accumulator 230 functions as a counter. The signal 235 is amplified by the amplifier 238 to generate the signal 239. The amplifier 238 represents averaging (Kint) of the frequency accumulator 230. The amplifiers 232 and 238 function as pre-gain and post-gain for the frequency accumulator 230.

The summation element 224 adds the signal 223 with the signal 239 to generate the phase accumulator input update signal 225. In one example, the phase update gain 220 and the frequency accumulator 230 form a loop filter that filters out noise and irrelevant frequency components within the delayed error signal 215.

The phase accumulator input update signal 225 is received by the summation element 242 of the phase accumulation circuitry 240. The summation element 242 combines the phase accumulator input update signal 225, the delayed signal 245 and the compensation signal 269 to generate the signal 243. By adding the phase accumulator input update signal 225 with the delayed signal 245, the phase accumulation circuitry 240 functions as a counter. In one example, the summation element 242 subtracts the delayed signal 245 and the compensation signal 269 from the phase accumulator input update signal 225 to generate the signal 243. The signal 243 is delayed by the delay element 244 of the phase accumulation circuitry 240 to generate the delayed signal 245. The delay of the delay element 244 is 1 update cycle. The signal 243 is amplified by the amplifier 246 to generate the signal 247. The amplifier 246 represents averaging Kv of the phase accumulator 240.

The signal 247 is received by the PMIX circuitry 250. The PMIX circuitry 250 shifts a corresponding phase by X degrees based on the signal 247. X may be in range of about 0 degrees to about 360 degrees. In one example, the phase of the PMIX circuitry 250 is shifted by a phase step or a plurality of phase steps. Each phase step corresponds to a phase shift of one or more degrees. Each phase step may correspond to the same size phase shift. In another example, at least two phase steps correspond to different size phase shifts.

In one example, the PMIX circuitry 250 is controlled by 256 PMIX codes. Each of the 256 PMIX codes corresponds to a different phase shift. In one or more example, the PMIX circuitry 250 is controlled by more than or less than 256 PMIX codes.

The phase of the PMIX circuitry 250 is shifted based on the signal 247 to generate the signal 251. The signal 251 is received by the amplifier 252. The signal 251 includes a non-linearity (INL impairment $q_{imp}$) of the PMIX circuitry 250.

The signal 251 is amplified by the amplifier 252 to generate the clock signal 204. The amplifier 252 represents the code to phase gain (e.g., parameter β) response of the PMIX circuitry 250. In one example, the signal 251 may be referred to as an impaired signal.

In one or more examples, the clock signal 204 is used by receiver circuitry (e.g., the receiver circuitry 120 of FIG. 1) to shift the phase of a clock signal of the receiver circuitry to be aligned with the phase of a transmitter clock signal (e.g., the clock signal of the transmitter circuitry 110 of FIG. 1) based on the rising edges of a data signal (e.g., the data signal 132 of FIG. 1).

Equations 2 and 3 are discrete transfer functions describing the phase of the clock signal 204 (e.g., output phase $\phi_{out}$) and output phase error $\phi_{err}$ of the CDR circuitry 201 relative to the phase of the input signal ($\phi_{in}$) 202.

$$\frac{\phi_{out}}{\phi_{in}} = \qquad\qquad\qquad\qquad\qquad\qquad\qquad \text{Equation 2}$$

$$\frac{phug * K_p K_v \beta (1-z^{-1}) z^{-d} + frug * K_p K_{int} K_v \beta z^{-d}}{(1-z^{-1})^2 + phug * K_p K_v \beta (1-z^{-1}) z^{-d} + frug * K_p K_{int} K_v \beta z^{-d}}$$

$$\frac{\phi_{err}}{\phi_{in}} = \qquad\qquad\qquad\qquad\qquad\qquad\qquad \text{Equation 3}$$

$$\frac{(1-z^{-1})^2}{(1-z^{-1})^2 + phug * K_p K_v \beta (1-z^{-1}) z^{-d} + frug * K_p K_{int} K_v \beta z^{-d}}$$

Figure 3:
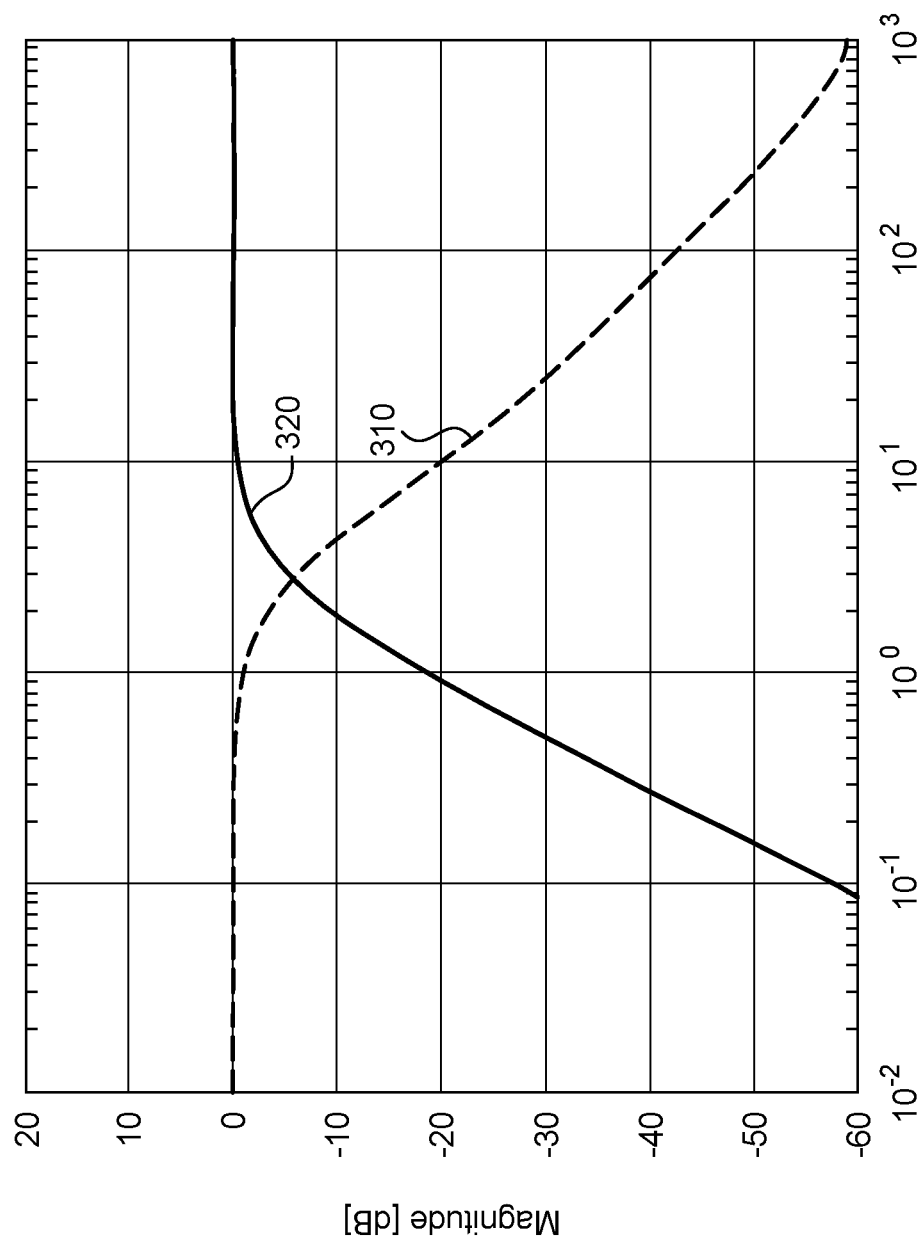
FIG. 3 illustrates a graph of the magnitude transfer-function of the phase error and output phase of clock and data recovery (CDR) relative to the CDR input phase, according to one or more examples.

FIG. 3 illustrates a graph 300 plotting the output phase, line 310, and the output phase error, line 320, as a function of frequency. The graph 300 illustrates that the output phase, line 310, is a low-pass version of the phase of the input signal 202 of FIG. 2 (e.g., the input phase). Further, the graph 300 illustrates that the phase error, line 320, is a high-pass function of the phase of the clock signal 204 of FIG. 2. Accordingly, the low-frequency variations in the input signal 202 are tracked by CDR circuitry. However, high-frequency variations in the input signal 202 are not tracked by CDR circuitry, and remain as residue output phase error.

In one or more examples, the CDR circuitry 201 cycles the PMIX circuitry 250 through each of the PMIX codes, and corresponding DNLs, to compensate for a frequency PPM deviation between a transmitter circuitry clock domain (e.g., the clock domain of the transmitter circuitry 110), and a receiver circuitry clock domain (e.g., the clock domain of the receiver circuitry 120). In one example, in the presence of a frequency offset, the phase accumulator 240 increments in equal steps, accumulating the phase of the clock signal 204. In an example here the PMIX circuitry 250 has a non-zero DNL, the DNL is accumulated, lead to residue INL at the output to the PMIX circuitry 250, e.g., within the signal 251. In one example, the impairment value $q_{imp}$ models the INL, and the compensation value $q_{cmp}$ is used to compensate for the INL.

In one example, each element of the CDR circuitry 201 is updated (e.g., performs a corresponding function) once per cycle of the update clock signal of the CDR circuitry 201. In one example, at each cycle of the clock signal of the CDR circuitry 201, a new compensation value $q_{cmp}$ is received at the input node 261.

Equation 4 is a loop equation that illustrates the output phase error with an additional error term that depends on the INL of the PMIX circuitry 250. The additional error term has a high-pass shape that mitigates the low-frequency components of the INL error profile. However, the high-frequency components of the INL error profile are not compensated, resulting in a residue phase error that reduces the performance of the corresponding receiver circuitry (e.g., the receiver circuitry 120).

$$\frac{\phi_{err}}{q_{imp}} = \frac{-(1-z^{-1})^2}{(1-z^{-1})^2 + phug * K_p K_v \beta(1-z^{-1})z^{-d} + frug * K_p K_{int} K_v \beta z^{-d}}$$

Equation 4

Further, in one or more examples where the cycling of the PMIX codes occurs at a rate that is within the bandwidth of the CDR circuitry 201, the CDR circuitry 201 compensates for the DNL within the CDR circuitry 201. However, compensating for the DNL is limited by the latency and bandwidth of the CDR circuitry 201. The finite bandwidth and latency may result in residue non-compensated phase error (e.g., DNL) that accumulates in time over the PMIX code space. The accumulation of the DNL is integral non-linearity (INL) of the CDR circuitry 201 and/or PMIX circuitry 250 over the PMIX code space. The accumulation of DNL generates excess phase error within the CDR circuitry 201, degrading the performance of the CDR circuitry 201. In one or more examples, the compensation circuitry 260 compensates for the accumulation of DNL, improving the performance of the CDR circuitry 201.

The compensation circuitry 260 receives a compensation value $q_{cmp}$ from the memory 280 and generates the compensation signal 269 to compensate the effects of the accumulated DNL (INL). Equation 5 is the loop equation for the CDR circuitry 201 including the compensation circuitry 260 when compensation value $q_{cmp}$=impairment value $q_{imp}$.

$$\frac{\phi_{err}}{\phi_{imp}} = \frac{-(1-z^{-1})^2(1-z^{-m})}{(1-z^{-1})^2 + phug * K_p K_v \beta(1-z^{-1})z^{-d} + frug * K_p K_{int} K_v \beta z^{-d}}$$

Equation 5

As illustrated by Equation 5, the compensation circuitry 260 compensates for the effects of INL within the CDR circuitry 201 by creating a high-pass function with higher bandwidth.

In one or more examples, the compensation circuitry 260 receives the compensation value $q_{cmp}$ from the memory 280 that is associated with the PMIX code used by the PMIX circuitry 250. The memory 280 receives an indication of the PMIX code used by the PMIX circuitry 250 from the CDR circuitry 201, and provides a corresponding compensation value $q_{cmp}$ to the compensation circuitry 260. In one example, the compensation circuitry 260 selects and obtains a compensation value $q_{cmp}$ associated with the PMIX code applied to the PMIX circuitry 250 from the memory 280. For example, the compensation circuitry 260 receives an indication of the PMIX code generated by the PMIX circuitry 250 and obtains the associated compensation value $q_{cmp}$ from the LUT 282 of the memory 280.

The compensation circuitry 260 includes input node 261, delay element 262, summation element 264, amplifier 266, and delay element 268. The delay of the delay element 262 is 1 update cycle. The input node 261 receives the compensation value $q_{cmp}$ from the memory 280. The compensation value $q_{cmp}$ is received and delayed by the delay element 262 to generate the delayed signal 263. The delay element 262 delays the compensation value $q_{cmp}$ by one period of a corresponding clock signal. The clock signal may be a clock signal of the CDR circuitry 201, the corresponding receiver circuitry (e.g., the receiver circuitry 120), or a PMIX update clock signal. The summation element 264 receives the compensation value $q_{cmp}$ and the delayed signal 263, and subtracts the delayed signal 263 from the compensation value $q_{cmp}$ to generate the signal 265. The signal 265 may be referred to as a non-linearity signal. Subtracting the delayed signal 263 from the compensation value $q_{cmp}$ performs a derivative function generating the signal 265 that is the DNL for the PMIX circuitry 250 from the compensation value $q_{cmp}$ that is the INL for the PMIX circuitry 250. The signal 265 is amplified by the amplifier 266 to generate the amplified signal 267.

The delay element 268 delays the amplified signal 267 by one or more periods of the corresponding clock signal, generating the compensation signal 269. In one example, the delay element 268 delays the amplified signal by "m" periods of the PMIX update clock cycle signal, where "m" is one or more.

Figure 4:
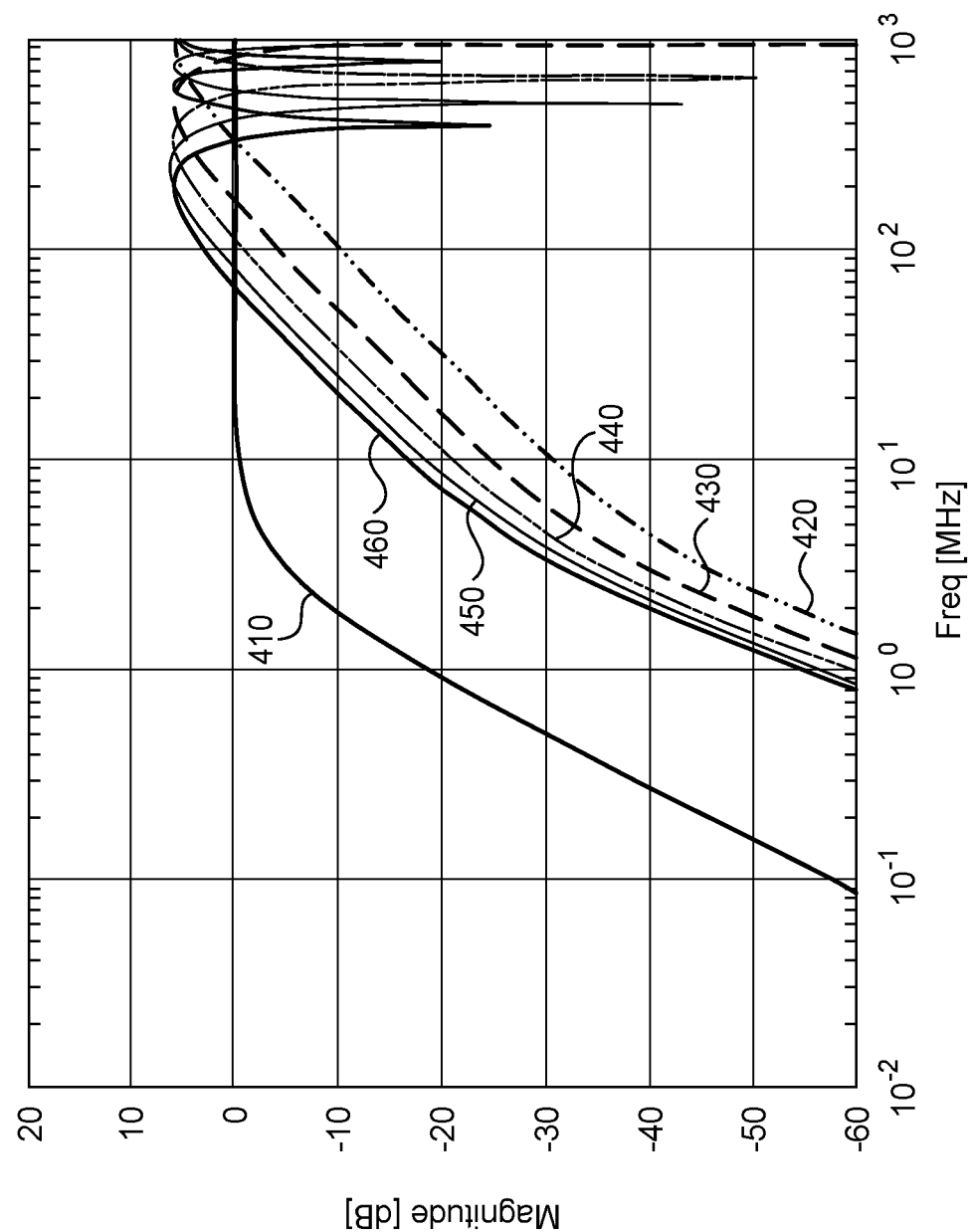
FIG. 4 illustrates a graph of the CDR circuitry phase error magnitude transfer-function associated with latency of a clock and data recovery system, according to one or more examples.

In one or more examples, as the latency of the CDR circuitry 201 increases (e.g., "m" increases), the amount of INL that is compensated for is reduced. FIG. 4 illustrates a graph 400 of the phase error transfer function for different latency values (e.g., values of "m"). For example, line 410 illustrates the phase error transfer function for no compensation applied. The line 420 illustrates the phase error transfer function for a latency of one clock period (e.g., "m" is 1). The line 430 illustrates the phase error transfer function for a latency of two clock periods (e.g., "m" is 2). The line 440 illustrates the phase error transfer function for a latency of three clock periods (e.g., "m" is 3). The line 450 illustrates the phase error transfer function for a latency of four clock periods (e.g., "m" is 4). The line 460 illustrates the phase error transfer function for a latency of five clock periods (e.g., "m" is 5).

In one or more examples, the compensation values $q_{cmp}$ stored within the memory 280 are determined during startup of the CDR circuitry 201 by evaluation circuitry within the CDR circuitry 201 or by an external processing system connected to the CDR circuitry 201. The clock signal 204 is measured for each of the PMIX code, to determine a compensation value $q_{cmp}$ for each of the PMIX codes. The compensation values $q_{cmp}$ may be determined by counting the occurrence of each PMIX code over a respective period of time. A histogram is determined based on the count values associated with each of the PMIX codes to determine the non-linearities of the PMIX circuitry 250. In other examples, the non-linearities of the PMIX circuitry 250 may be measured by comparing the output phase of the PMIX circuitry 250 to an expected input phase of the input signal 202.

The compensation values $q_{cmp}$ corresponds to a measurement of integral non-linearities (INL) within the PMIX circuitry 250. The compensation values $q_{cmp}$ indicate a deviation between an expected output of the PMIX circuitry 250 and a measured output of the PMIX circuitry 250 for each of the PMIX codes. The compensation values $q_{cmp}$ are stored within the memory 280. In one example, the compensation values $q_{cmp}$ are stored within a look-up table (LUT) 282 of the memory 280. The LUT 282 stores an association between each of the compensation values $q_{cmp}$ and the PMIX codes. In one example, the PMIX codes include 256 PMIX codes. In such an example, the LUT 282 includes an entry for each PMIX code and associated compensation value $q_{cmp}$. In one example, the compensation value $q_{cmp}$ corresponds to the impairment value $q_{imp}$.

Figure 5:
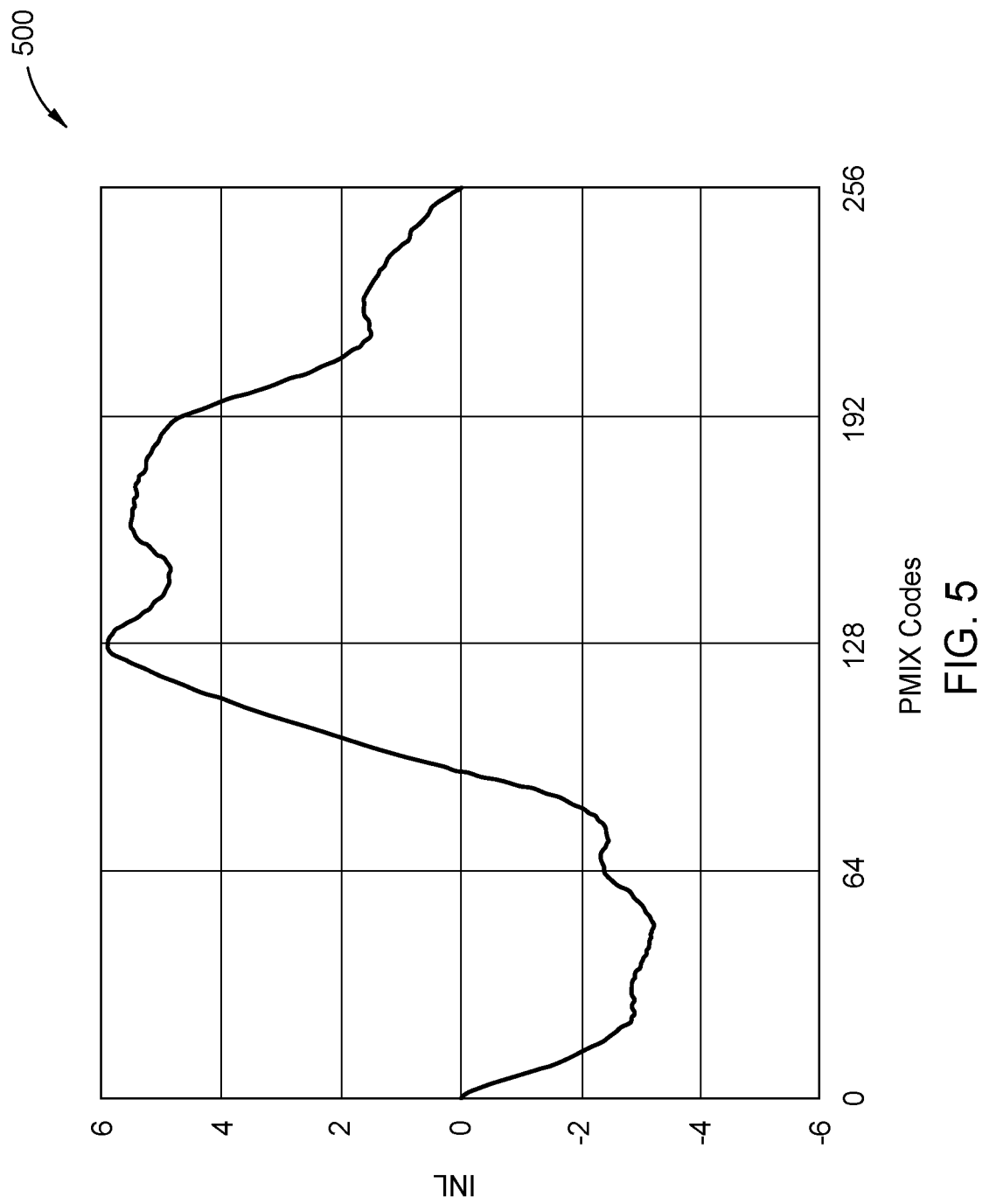
FIG. 5 illustrates a graph of integral non-linearity values and associated phase mixer codes, according to one or more examples.

FIG. 5 illustrates graph 500 that is an example INL profile for PMIX circuitry (e.g., PMIX circuitry 250 of FIG. 2) having 256 PMIX codes. Each of the PMIX codes is associated with a different INL value (e.g., compensation value $q_{cmp}$).

Figure 6:
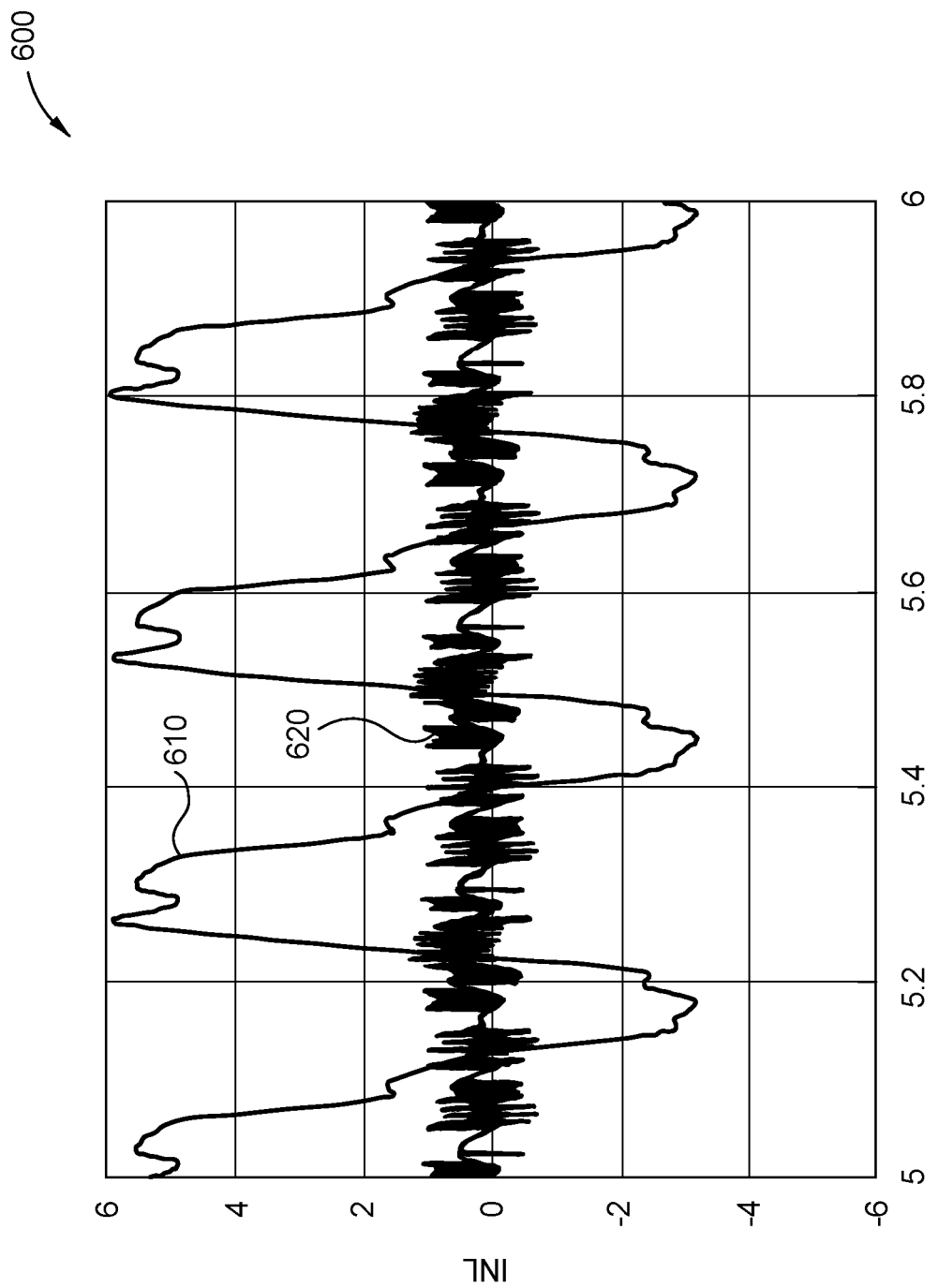
FIG. 6 illustrates integral non-linearity of clock and data recovery circuitry before and after non-linearity mitigation, according to one or more examples.

FIG. 6 illustrates graph 600 of a profile of the PMIX codes of PMIX circuitry (e.g., the PMIX circuitry 250 of FIG. 2) as a function of time. Line 610 of the graph 600 illustrates the INL of the PMIX output phases (e.g., the INL impairment $q_{imp}$) without compensation of the INL being applied. Further line 620 of the graph 600 illustrates the INL of the PMIX output phases with compensation of the INL being applied when using compensation circuitry (e.g., the compensation circuitry 260 of the CDR circuitry 201). As illustrated by FIG. 6, the magnitude of INL is reduced through the use compensation circuitry (e.g., compensation circuitry 260) with the CDR circuitry, improving the performance of the corresponding receiver circuitry.

In one example, the bit error rate (BER) of receiver circuitry (e.g., the receiver circuitry 120 of FIG. 1) that includes CDR circuitry (e.g., the CDR circuitry 201 of FIG. 2) with compensation circuitry (e.g., the compensation circuitry 260 of FIG. 2) is reduced as compared to other receiver circuitries. For example, the BER of such receiver circuitry is improved from about 3e-9 to 3e-12. Further, in one or more examples, the signal-to-noise ratio (SNR) of such receiver circuitry improved by about 3 dB when using compensation technique as described above.

Figure 7:
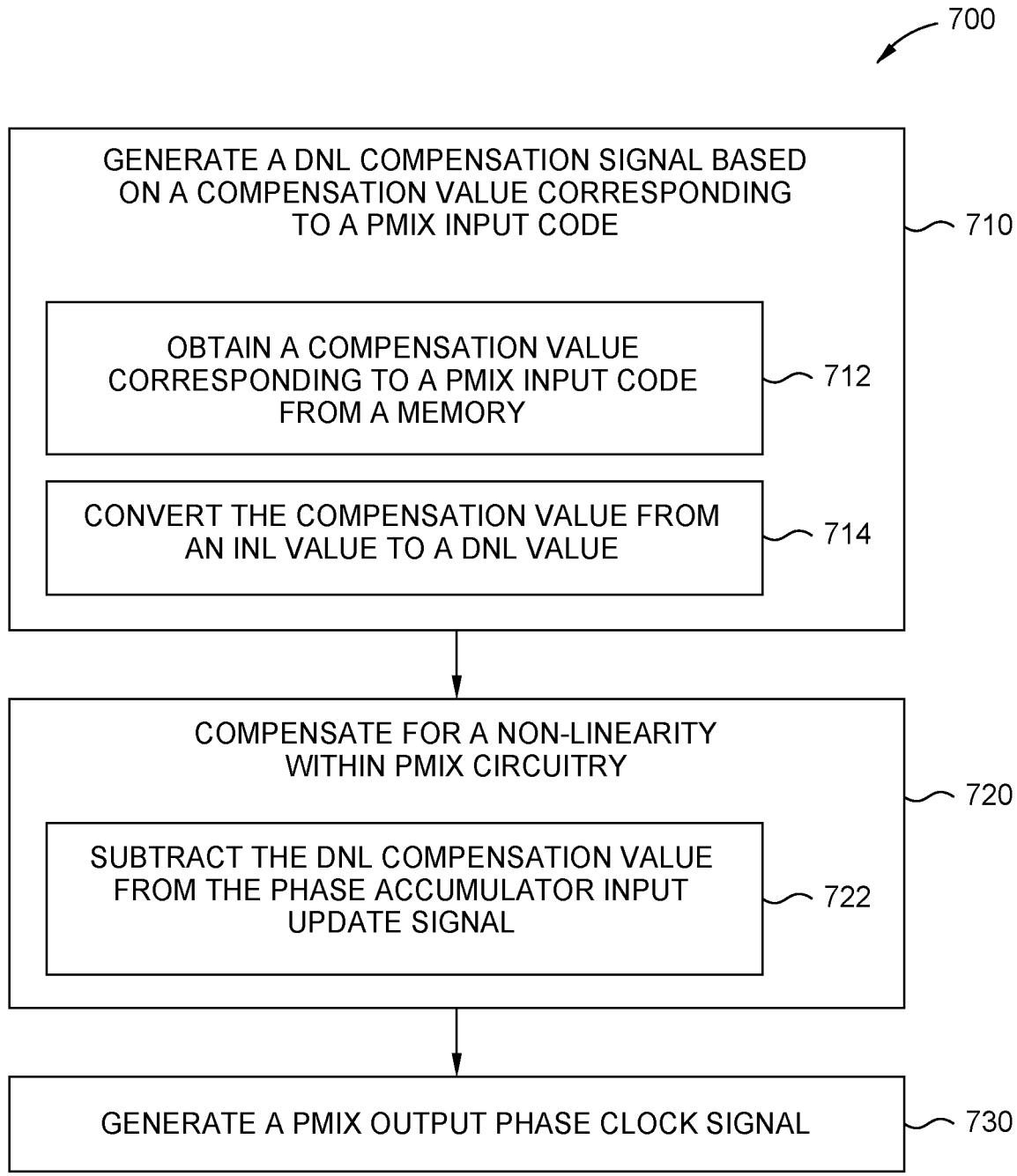
FIG. 7 illustrates a method of compensating for a non-linearity within receiver circuitry, according to one or more examples.

FIG. 7 illustrates a flowchart of a method 700 for compensating for a non-linearity within receiver circuitry (e.g., the receiver circuitry 120). The method 700 is performed by the CDR system 200 of FIG. 2. At 710 of the method 700, a compensation signal for each PMIX code is provided and denoted by $q_{cmp}$. The compensation circuitry 260 obtains a compensation value $q_{cmp}$ from the LUT 282 of the memory 280 at 712 of the method 700. The compensation value $q_{cmp}$ corresponds to a PMIX code used by the PMIX circuitry 250 to generate the clock signal 204. The compensation signal is generated from the compensation value $q_{cmp}$ by the compensation circuitry 260. In one example, the compensation value $q_{cmp}$ corresponds to INL of the PMIX circuitry 250. At 714 of the method 700, the compensation circuitry 260 converts the compensation value $q_{cmp}$ corresponds from an INL value to a DNL value, where the DNL value represents the compensation signal. In one example, the delay element 262 subtracts the previous compensation value from the current compensation value, performing a derivative function, to generate the compensation signal. The compensation signal corresponds to a DNL of the PMIX circuitry 250.

In one example, during a first period, the PMIX circuitry 250 generates the clock signal 204 based on a first PMIX code of a plurality of PMIX codes. The compensation circuitry 260 obtains a compensation value $q_{cmp1}$ associated with the first PMIX code from the memory 280 during the first period. During a second period, the PMIX circuitry 250 generates the clock signal 204 based on a second PMIX code of a plurality of PMIX codes. Further, during the second period, the compensation circuitry 260 obtains a second compensation value $q_{cmp2}$ associated with the second PMIX code from the memory and generates a corresponding compensation signal (e.g., the compensation signal 269). As the PMIX circuitry 250 cycles through PMIX codes to generate the clock signal 204, the compensation circuitry 260 obtains a respective compensation value $q_{cmp}$ from the memory 280.

At 720 of the method 700, compensation of a non-linearity within the PMIX circuitry is performed. For example, phase accumulation circuitry (e.g., phase accumulation circuitry 240 of FIG. 2) receives a compensation signal (e.g., the compensation signal 269), and a phase accumulator input update signal 225. The compensation signal 269 is combined with the phase accumulator input update signal 225 to compensate for a non-linearity within the PMIX circuitry (e.g., the PMIX circuitry 250 of FIG. 2). For example, at 722 of the method 700, a DNL compensation value (e.g., compensation signal 269 of FIG. 2) is subtracted from the phase accumulator input update signal (e.g., phase accumulator input update signal 225 of FIG. 2) by a summation element (e.g., the summation element 242 of FIG. 2) to compensate for a non-linearity within the PMIX circuitry (e.g., the PMIX circuitry 250 of FIG. 2). In one example with reference to FIG. 2, combining the compensation signal 269 with the phase accumulator input update signal 225 includes injects a non-linearity value (e.g., DNL) via the compensation signal 269 into the phase accumulator 240 to compensate for a non-linearity within the PMIX circuitry 250.

At 730 of the method 700, the clock signal is generated by the PMIX circuitry. For example with reference to FIG. 2, the PMIX circuitry 250 generates the clock signal 204 based on the signal 247 that is generated from the compensated signal 243. In one or more examples, the PMIX circuitry 250 generates the signal 251 further based a PMIX code to generate the clock signal 204.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A clock and data recovery (CDR) system comprising:
compensation circuitry that generates a first compensation signal based on a first compensation value received from via an input node of the compensation circuitry, the compensation circuitry comprises:
  a first delay element that delays the first compensation value; and
  a summation element that generates a non-linearity signal from the first compensation value and the delayed first compensation value, wherein the first delay element is coupled between the input node and a first input of the summation element, and wherein a second input of the summation element is coupled to the input node; and
phase accumulation circuitry that:
  receives the first compensation signal and a phase accumulator input update signal, and
  combines the first compensation signal with the phase accumulator input update signal to compensate for a first non-linearity within phase mixer (PMIX) circuitry.

2. The CDR system of claim 1, wherein the first compensation value is associated with a first PMIX code of a plurality of PMIX codes of the PMIX circuitry.

3. The CDR system of claim 2, wherein the compensation circuitry is further configured to generate a second compensation signal based on a second compensation value, wherein the second compensation value is associated with a second PMIX code of the plurality of PMIX codes.

4. The CDR system of claim 2, wherein the PMIX circuitry generates a clock signal further based on the first PMIX code.

5. The CDR system of claim 1, wherein the
summation element is configured to subtract the delayed first compensation value from the first compensation value to generate the non-linearity signal, and
wherein the compensation circuitry further comprises a second delay element that outputs the first compensation signal based on the non-linearity signal.

6. The CDR system of claim 1, wherein the first compensation value corresponds to an integral non-linearity (INL), and the compensation circuitry is configured to convert the first compensation value from an INL to a differential non-linearity (DNL) to generate the first compensation signal.

7. The CDR system of claim 1 further comprising a memory configured to store the first compensation value, and wherein the first compensation value is obtained from the memory by the compensation circuitry.

8. The CDR system of claim 7, wherein the PMIX circuitry comprises a plurality of PMIX codes, and the memory comprises a respective compensation value for each of the plurality of PMIX codes.

9. A method comprising:
receiving, at an input node, a first compensation value;
generating a first compensation signal based on the first compensation value by:
  delaying, with a first delay element, the first compensation value; and
  generating, with a summation element, a non-linearity signal from the first compensation value and the delayed first compensation value, wherein the first delay element is coupled between the input node and an input of the summation element and a second input of the summation element is coupled to the input node;
compensating for a first non-linearity within phase mixer (PMIX) circuitry based on the first compensation signal and a phase accumulator input update signal to generate a compensated signal; and
generating a clock signal based on the compensated signal by the PMIX circuitry.

10. The method claim 9, wherein the first compensation value is associated with a first PMIX code of a plurality of PMIX codes of the PMIX circuitry.

11. The method of claim 10 further comprising generating a second compensation signal based on a second compensation value, wherein the second compensation value is associated with a second PMIX code of the plurality of PMIX codes.

12. The method claim 10, wherein the clock signal is generated based on the first PMIX code.

13. The method claim 9, wherein the first compensation value corresponds to an integral non-linearity (INL), generating the first compensation signal comprises converting the first compensation value from an INL to a differential non-linearity (DNL).

14. The method of claim 9, wherein the first compensation value is received from a memory comprising a respective compensation value for each PMIX code of the PMIX circuitry.

15. A non-transitory computer readable medium comprising stored instructions, which when executed by a processor, cause the processor to:
provide compensation circuitry of clock and data recovery (CDR) circuitry, wherein the compensation circuitry comprises:
  an input node that receives a first compensation value;
  a first delay element that receives the first compensation value from the input node and delays the first compensation value; and
  a summation element that subtracts a delayed version of the first compensation value from the first compensation value to generate a first non-linearity value, wherein the first delay element is coupled between the input node and a first input of the summation element, and wherein a second input of the summation element is coupled to the input node, wherein the compensation circuitry generates a first compensation signal based on the first non-linearity value; and
provide phase accumulation circuitry of the CDR circuitry, wherein the phase accumulation circuitry compensates for a first non-linearity within phase mixer (PMIX) circuitry based on the first compensation signal.

16. The non-transitory computer readable medium of claim 15, wherein the processor is further caused to provide the PMIX circuitry that generates a clock signal based on a first PMIX code.

17. The non-transitory computer readable medium of claim 16, wherein the first compensation value is associated with the first PMIX code.

18. The non-transitory computer readable medium of claim 15, wherein the compensation circuitry further comprises a second delay element that generates the first compensation signal based on the first non-linearity value.

19. The non-transitory computer readable medium of claim 15, wherein the phase accumulation circuitry further receives a phase accumulator input update signal, and combines the first compensation signal with the phase accumulator input update signal to compensate for the first non-linearity within the PMIX circuitry.

20. The non-transitory computer readable medium of claim 15, wherein the processor further provides a memory comprising a look-up-table including a respective compensation value for each of a plurality of PMIX codes, and wherein the input node receives the first compensation value from the memory.

* * * * *